(12) United States Patent
Marsh

(10) Patent No.: US 6,342,445 B1
(45) Date of Patent: Jan. 29, 2002

(54) METHOD FOR FABRICATING AN SRRUO$_3$ FILM

(75) Inventor: Eugene P. Marsh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/571,718

(22) Filed: May 15, 2000

(51) Int. Cl.$^7$ ............................................... H01L 21/44
(52) U.S. Cl. ...................... 438/681; 257/49; 257/51; 257/295; 257/296; 257/627; 257/636
(58) Field of Search ...................... 438/681; 257/295, 257/296, 627, 49, 636, 51

(56) References Cited

U.S. PATENT DOCUMENTS 5,987,301 A * 11/1999 Fukushima et al. ......... 257/306
6,051,858 A *  4/2000 Uchida et al. .............. 257/295
6,060,735 A *  5/2000 Izuha et al. ................. 257/295
6,100,578 A *  8/2000 Suzuki ....................... 257/627

OTHER PUBLICATIONS

Mitsuaki Izuha, et al., "Electrical Properties of All–Perovskite Oxide (SrRuO$_3$/Ba$_x$Sr$_{1-x}$Sr$_{1-x}$TiO$_3$/ SrRuO$_3$)", Jpn. J. Appl. Phys. vol. 36 (1997) pp. 5866–5869.

Charles T. Black, et al., "Electric–Field Penetration Into Metals: Consequences for High–Dielectric–Constant Capacitors" IEEE Transactions on Electron Devices, vol. 46, No. 4, Apr. 4, 1999, pp. 776–780.

* cited by examiner

*Primary Examiner*—Richard Elms
*Assistant Examiner*—Pho Luu
(74) *Attorney, Agent, or Firm*—Dickstein Shapiro Morin & Oshinsky LLP

(57) ABSTRACT

A method of fabricating an SrRuO$_3$ thin film is disclosed. The method utilizes a multi-step deposition process for the separate control of the Ru reagent, relative to the Sr reagent, which requires a much lower deposition temperature than the Sr reagent. A Ru reagent gas is supplied by a bubbler and deposited onto a substrate. Following the deposition of the Ru reagent, the Sr liquid reagent is vaporized and deposited onto the Ru layer.

35 Claims, 3 Drawing Sheets

METHOD FOR FABRICATING AN SRRUO₃ FILM

BACKGROUND OF THE INVENTION

1. Field of the Invention

This invention relates generally to the field of thin dielectric films. More specifically, the invention relates to the formation of an $SrRuO_3$ film by deposition utilizing independent deposition segments for each of the dissimilar precursor compositions.

2. Description of the Related Art

Barium strontium titanate, $BaSrTiO_3$ is one of the most promising candidates as a dielectric material for post-1-Gbit dynamic random access memory capacitors. However, as device sizes continue to shrink, the thickness of the dielectric must be reduced in order to increase the accumulated charge capacitance and reduce the capacitor area,. In thin dielectric films with thickness on the order of several tens of nm, a low leakage current and a higher dielectric constant are required. However, when a dielectric is made very thin, unwanted changes, such as an increase in leakage current and a decrease in the dielectric constant relative to the bulk, may occur. Although the origins of these phenomena are not completely understood, they are known to depend greatly on the materials used for the capacitor electrodes.

Currently, there are numerous possible candidates for the electrodes used in $BaSrTiO_3$ capacitors, including Pt, Ir, Ru and $RuO2$. However, $SrRuO_3$ is one of the most promising candidates for an electrode material having an improved performance with respect to capacitance, leakage degradation and lattice match for $BaSrTiO_3$.

In the formation of thin films, layers and coatings on substrates, a wide variety of source materials have been employed. These source materials include reagents and precursor materials of widely varying types, and in various physical states. To achieve highly uniform thickness layers of a conformal character on the substrate, vapor phase deposition has been used widely. In vapor phase deposition, the source material may be of initially solid form which is sublimed or melted and vaporized to provide a desirable vapor phase source reagent. Alternatively, the reagent may be of normally liquid state, which is vaporized, or the reagent may be in the vapor phase in the first instance Conventionally, these reagents may be used in mixture with one another in a multicomponent fluid which is utilized to deposit a corresponding multicomponent or heterogeneous film material such as $SrRuO_3$. Such advanced thin film materials are increasingly important in the manufacture of microelectronic devices and in the emerging field of nanotechnology. For such applications and their implementation in high volume commercial manufacturing processes, it is essential that the film morphology, composition and stoichiometry be closely controlled. This in turn requires highly reliable and efficient methods for deposition of source reagents to the locus of film formation.

Various technologies well known in the art exist for applying thin films to substrates or other substrates in manufacturing steps for integrated circuits (ICs). For instance, Chemical Vapor Deposition (CVD) is a often-used, commercialized process. Also, a relatively new technology, Atomic Layer Deposition (ALD), a variant of CVD, is now emerging as a potentially superior method for achieving uniformity, excellent step coverage, and transparency to substrate size. ALD however, exhibits a generally lower deposition rate (typically about 100 ang/min) than CVD (typically about 1000 ang/min).

Chemical vapor deposition (CVD) is a particularly attractive method for forming thin film materials such as $SrRuO_3$ because of the conformality, composition control, deposition rates and microstructural homogeneity. Further, it is readily scaled up to production runs and the electronics industry has a wide experience and an established equipment base in the use of CVD technology which can be applied to new CVD processes. In general, the control of key variables such as stoichometry and film thickness and the coating of a wide variety of substrate geometries is possible with CVD. Forming the thin films by CVD permits the integration of $SrRuO_3$ into existing device production technologies.

ALD, although a slower process than CVD, demonstrates a remarkable ability to maintain ultra-uniform thin deposition layers over complex topology. This is at least partially because ALD is not flux dependent as CVD processes are. In other words, CVD requires specific and uniform substrate temperature and precursors to be in a state of uniformity in the process chambers in order to produce a desired layer of uniform thickness on a substrate surface. This flux-independent nature of ALD allows processing at lower temperatures than with conventional CVD processes.

However, in either case, when the film being deposited is a multicomponent material, such as $SrRuO_3$, rather than a pure element, controlling the deposition of the film is critical to obtaining the desired film properties. In the deposition of such materials, which may form films with a wide range of stoichiometries, the controlled delivery of the source reagents into the reactor chamber is essential.

The present invention is directed to controlling the delivery of source reagents into the reactor chamber to produce thin films of $SrRuO_3$.

SUMMARY OF THE INVENTION

The present invention is directed to a method of fabricating an $SrRuO_3$ thin film. The method utilizes a multi-step deposition process for the separate control of the Ru reagent, relative to the Sr reagent, which requires a much lower deposition temperature than the Sr reagent.

A Ru reagent gas is supplied by a bubbler and deposited onto a substrate at temperatures below 200° C. Following the deposition of the Ru reagent, the Sr liquid reagent is vaporized and deposited onto the Ru layer at temperatures above 200° C.

BRIEF DESCRIPTION OF THE DRAWINGS

The foregoing and other advantages and features of the invention will become more apparent from the detailed description of the invention given below with reference to the accompanying drawings in which.

DETAILED DESCRIPTION OF THE PREFERRED EMBODIMENTS

Figure 1:
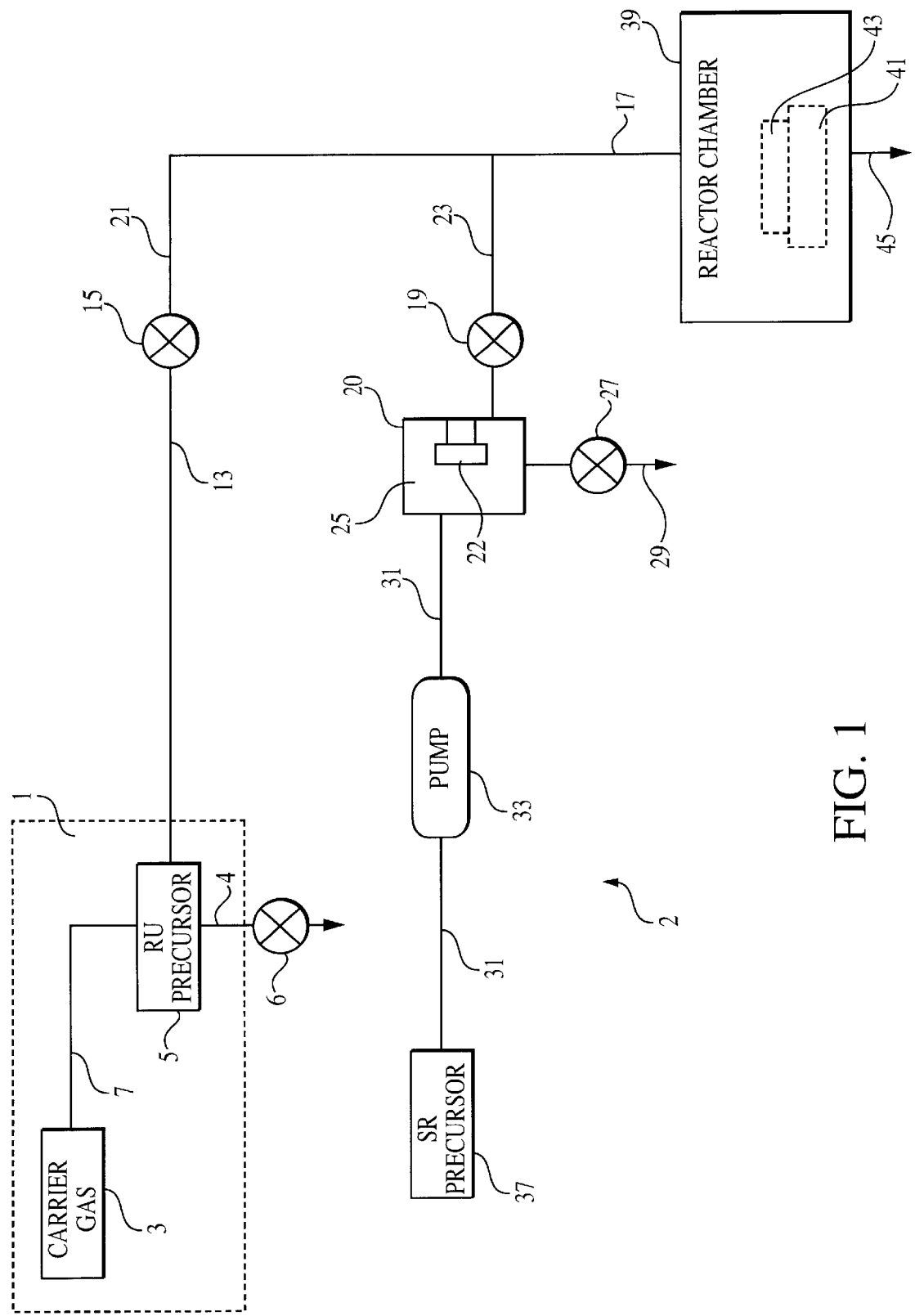
FIG. 1 is a schematic representation of an apparatus according to the present invention as employed for the fabrication of an $SrRuO_3$ film.

The present invention will be described as set forth in FIGS. 1–3. Other embodiments may be utilized and structural or logical changes may be made without departing from the spirit or scope of the present invention. Although the invention is illustrated in the drawings in connection with CVD processes, the invention may also be practiced using ALD processes as well. In general, the invention may be applicable wherever deposition is utilized for the deposition of SrRuO$_3$ thin films. Like items are referred to by like reference numerals.

The term "substrate" used in the following description may include any semiconductor-based structure that has an exposed silicon surface. Structure must be understood to include silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to substrate in the following description, previous process steps may have been utilized to form regions or junctions in or on the base semiconductor or foundation.

Referring now to the drawings, FIG. 1 illustrates a reaction chamber 39 coupled by a precursor feed line 17 and branch feed line 21 further connecting to a bubbler 1. Bubbler 1 comprises a reaction vessel 5 containing the Ru precursor or reagent, such as tricarbonyl (1-3 cyclohexadiene) ruthenium (Ru), ruthenium acetylacetonate, ruthenocene, triruthenium dodecacarbonyl or tris (2,2,6,6-tetramethyl-3,5-heptanedionato) ruthenium, which is connected to a gas carrier vessel 3, by a carrier feed line 7. The gas carrier vessel 3 contains a carrier gas such as Ar, He, N$_2$, CO or any other gases inert to a Ru precursor for effecting the transport of the vapor precursor Ru to the reaction chamber 39. The reaction vessel 5 is maintained at a temperature of about 25° C. The reaction vessel 5 is also coupled to an exhaust or bypass line 4 containing flow control valve 6, whereby the flow of precursor vapor may be bypassed from the reaction chamber. Further, branch feed line 21 is provided with flow control valve 15 therein which may be selectively opened or closed to flow the precursor to the reaction chamber 39 or to terminate the flow of precursor vapor to the reactor by closure of the valve. Flow control valve 15 may also be partially opened to regulate the flow therein of the precursor vapor.

Further, as shown in FIG. 1 the precursor feed line 17 is also coupled to branch feed line 23 connecting to the vaporizer unit 20. Vaporizer unit 20 has an interior volume 25 therein containing a vaporizer element 22 for effecting vaporization of the liquid precursor such as, Sr(2,2,6,6-tetramethyl-3,5-heptanedionate)$_2$("Sr (THD)"$_2$), or Sr bis (triisopropylcyclopentadienyl), flowed to the vaporizer unit for vaporization of the precursor therein to form precursor vapor. Vaporizer branch line 23 is provided with flow control valve 19 therein, which may be selectively opened or closed to flow the precursor to the reaction chamber 39 or to terminate the flow of precursor vapor to the reactor by closure of the valve. The vaporizer unit 20 is also coupled to an exhaust or bypass line 29 containing flow control valve 27, whereby the flow of precursor vapor may be bypassed from the reaction chamber 39. Flow control valve 19 may also be partially opened to regulate the flow there through of the precursor vapor.

Vaporizer 20 receives liquid Sr precursor in line 31, having pump 33 disposed therein. As used herein, the term "pump" is intended to be broadly construed to include all suitable motive fluid driver means, including, without limitation, pumps, compressors, ejectors, eductors, mass flow controllers, pressure-building circuits, peristaltic drivers, and any other means by which fluid may be conducted through conduit, pipe, line or channel structures. Supply vessel 37 containing liquid Sr precursor (for instance, Sr (THD)$_2$ in a solution of about 0.1M butyl acetate) is coupled by line 31 to pump 33 which receives the Sr precursor and flows the precursor to vaporizer unit 20 in line 31.

Hence, the vaporized precursors are flowed from the bubbler 1 and vaporizer unit 20 in precursor feed line 17 to the reaction chamber 39, in which the precursor vapors of Ru and Sr are contacted with a substrate 43 on support 41 to deposit a film of the desired character, and with spent precursor vapor being exhausted from the reaction chamber 39 in line 45, for recycle, treatment or other disposition thereof.

With the FIG. 1 arrangement, the Ru precursor is first deposited on substrate 43 in reaction chamber 39 which is maintained at a pressure of about 0.5–10 torr, preferably around 3 torr. The substrate 43 surface temperature is maintained at about 150° C.–600° C., preferably at temperatures below 200° C. The Ru precursor is deposited to a thickness of about 50–500A and the quantity of the Ru precursor gas is maintained at about 30–50 sccm. The deposition time is approximately 2–10 minutes.

After deposition of a Ru precursor, the Sr precursor is deposited on substrate 43 in reaction chamber 39 which is maintained at a pressure of about 0.5–10 torr, preferably around 3 torr. The substrate 43 surface temperature is maintained at about 325° C.–700° C., preferably at temperatures above 200° C. The Sr precursor is deposited to a thickness of about 50–500A and the quantity of the Sr precursor gas is maintained at about 30–50 sccm. The deposition time is around 1–4 minutes. Following the deposition of Ru and Sr, a post annealing process is performed at a temperature about 550° C.–850° C. for about 10 seconds to about 30 minutes, preferably around 700° C. for about 30 seconds.

Thus, the present invention provides a unique, independent method of depositing each of the components necessary for the fabrication of an SrRuO$_3$ film. Accordingly, separate control of the Ru reagent which requires a much lower deposition temperature than Sr reagent is thereby facilitated, for the purpose of optimizing the SrRuO$_3$ film formation process to yield a desired SrRuO$_3$ film on the substrate 43 in the reaction chamber 39.

Figure 2:
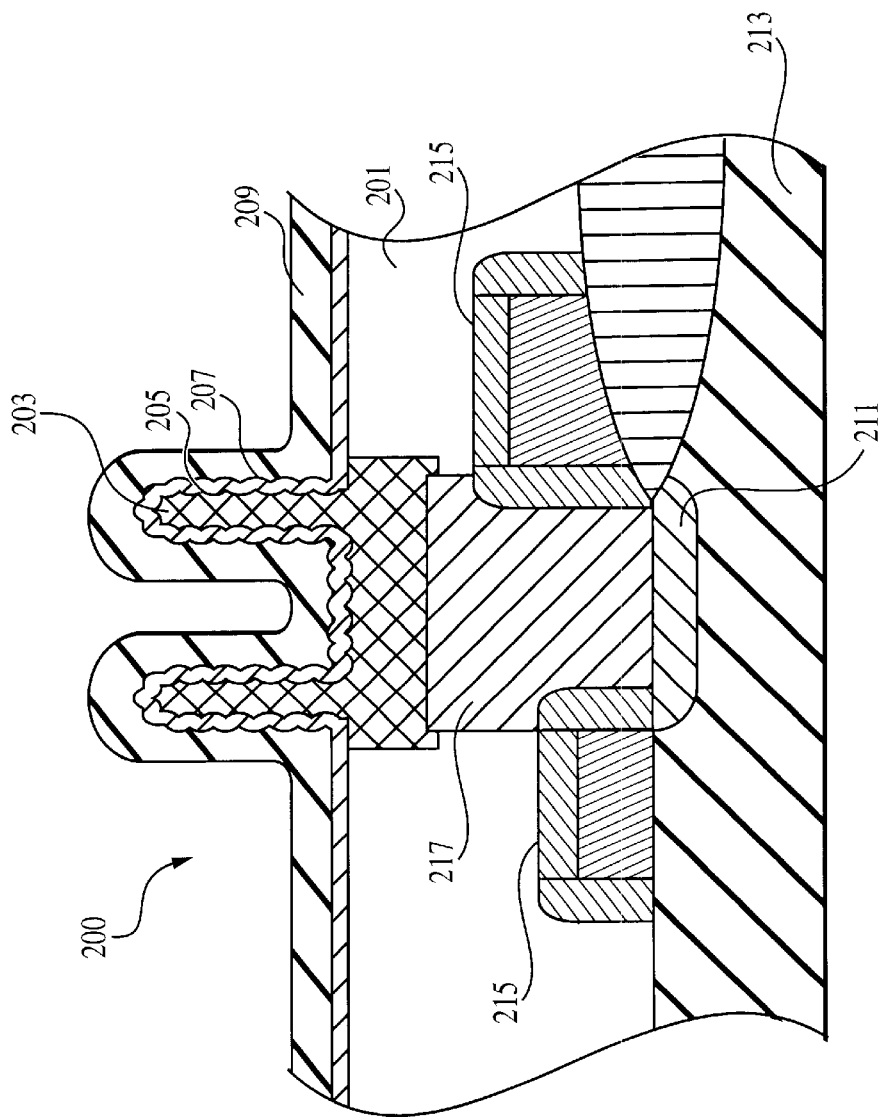
FIG. 2 is a schematic representation of a multiple layer film formed utilizing $SrRuO_3$ fabricated in accordance with a method of the present invention.

FIG. 2 is a schematic representation of a container capacitor 200 for memory cells, said capacitor having SrRuO$_3$ conductor fabricated according to the present invention. A first insulating layer 201 provides electrical isolation for underlying electronic devices such as thin film field effect transistors (FETs). A second insulating layer (not shown) is formed over the first insulating layer 201, and a via etched through the second insulating layer which may act as a template for the container capacitor 200. Via walls are lined with a conductive material 203, namely SrRuO$_3$ film fabricated by the method of the present invention. A planarizing etch is conducted to remove excess SrRuO$_3$ over the top surface of the second insulating layer. The remaining second insulating layer may then be etched away to expose an outside surface 205. The SrRuO$_3$ film 203 represents the bottom or storage electrode of the container capacitor 200. A thin dielectric layer 207 is then formed over SrRuO$_3$ film 203, followed by a second conductive layer 22 (e.g., also SrRuO$_3$ film), which represents the top or reference electrode for the container capacitor 200. By following the contours of the three-dimensional container structure, the effective electrode surface area is substantially increased, allowing for substantially greater capacitance. Also, contact is made between the container capacitor 200 and an underlying active area 211 of the semiconductor substrate 213 between narrowly spaced transistor gates 215 (e.g., DRAM word lines), as shown in FIG. 2. The actual contact is made by a contact conductive plug 217 which can be formed prior to formation of the container capacitor structure.

Figure 3:
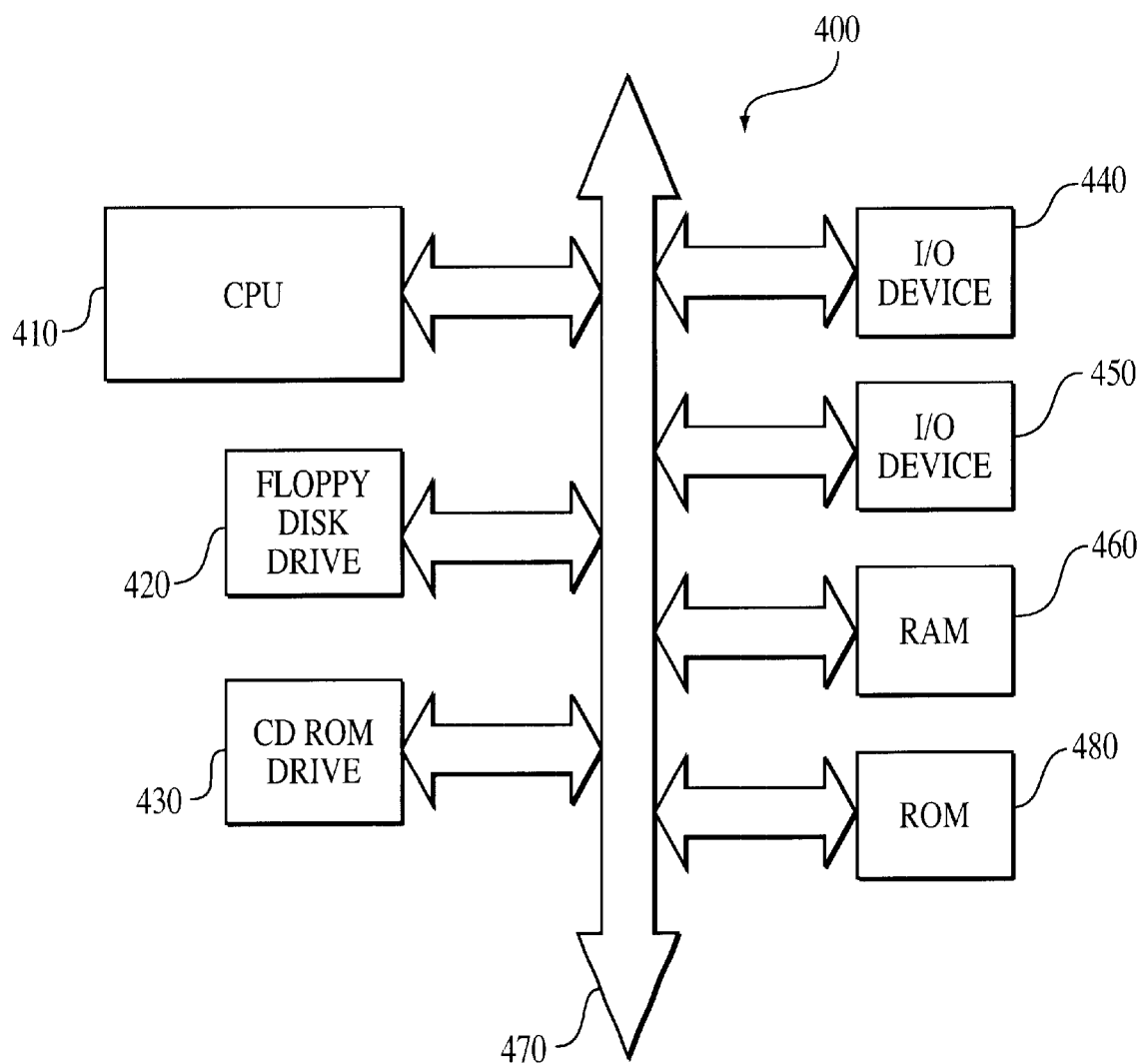
FIG. 3 illustrates in block diagram form a processor based system including a memory device employing a capacitor having a conductor formed of an $SrRuO_3$ film fabricated in accordance with a method of the present invention.

A typical processor based system which includes a memory device, e.g. RAM 460 containing capacitor having $SrRuO_3$ conductors fabricated according to the present invention is illustrated generally at 400 in FIG. 3. A computer system is exemplary of a system having integrated circuits, such as for example memory circuits. Most conventional computers include memory devices permitting storage of significant amounts of data. The data is accessed during operation of the computers. Other types of dedicated processing systems, e.g., radio systems, television systems, GPS receiver systems, telephones and telephone systems also contain memory devices which can utilize the present invention.

A processor based system, such as a computer system 400, for example, generally comprises a central processing unit (CPU) 410, for example, a microprocessor, that communicates with one or more input/output (I/O) devices 440, 450 over a bus 470. The computer system 400 also includes the random access memory (RAM) 460, read only memory (ROM) 480 and may include peripheral devices such as a floppy disk drive 420 and a compact disk (CD) ROM drive 430 which also communicate with CPU 410 over the bus 470. RAM 460 preferably has storage capacitor which includes $SrRuO_3$ conductors formed as previously described with reference to FIG. 1. It may also be desirable to integrate the processor 410 and memory 460 on a single IC chip.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A method of fabricating an $SrRuO_3$ film, comprising:
   depositing a first component of said film on a substrate at a first temperature;
   depositing a second component of said film on said substrate at a second temperature higher than said first temperature wherein said deposition of said second component is performed separately from said first component; and
   annealing said first and second components to form an $SrRuO_3$ thin film.

2. The method of claim 1 wherein said deposition of said first and second components is performed by CVD.

3. The method of claim 1 wherein said deposition of said first and second components is performed by ALD.

4. The method of claim 1 wherein said first component is selected from the group consisting of tricarbonyl (1-3 cyclohexadiene) ruthenium (Ru), ruthenium acetylacetonate, ruthenocene, triruthenium dodecacarbonyl or tris (2,2,6,6-tetramethyl-3,5-heptanedionato) ruthenium.

5. The method of claim 1 wherein said second component is selected from the group consisting of $Sr(2,2,6,6$-tetramethyl-3,5-heptanedionate$)_2$, or Sr bis (triisopropylcyclopentadienyl).

6. The method of claim 1 wherein said first temperature is about 150° C.–600° C.

7. The method of claim 1 wherein said first temperature is less than 200° C.

8. The method of claim 1 wherein said second temperature is about 325° C.–700° C.

9. The method of claim 1 wherein said second temperature is higher than 200° C.

10. The method of claim 1 wherein said first component is deposited to a thickness of about 50–500A.

11. The method of claim 1 wherein said second component is deposited to a thickness of about 50–500A.

12. The method of claim 1 wherein said first component is deposited for about 2–10 minutes.

13. The method of claim 1 wherein said second component is deposited for about 1–4 minutes.

14. The method of claim 1 wherein said first and second component is deposited at a pressure of about 0.5–10 torr.

15. The method of claim 1 wherein said deposition of said first component comprises the use of a bubbler to generate a first vapor component.

16. The method of claim 15 wherein said bubbler utilizes a He carrier.

17. The method of claim 15 wherein said bubbler utilizes an Ar carrier.

18. The method of claim 15 wherein said bubbler utilizes an $N_2$ carrier.

19. The method of claim 15 wherein said bubbler utilizes an CO carrier.

20. The method of claim 15 wherein said bubbler utilizes a gas inert to a Ru precursor.

21. The method of claim 1 wherein said deposition of said second component comprises the use of a vaporizer to generate a second vapor component.

22. An $SrRuO_3$ thin film comprising:
    an annealed film formed from a first component deposited on a substrate at a first temperature and a second component deposited on said first component at a second temperature higher than said first temperature.

23. The device of claim 22 wherein said first component is selected from the group consisting of tricarbonyl (1-3 cyclohexadiene) ruthenium (Ru), ruthenium acetylacetonate, ruthenocene, triruthenium dodecacarbonyl or tris (2,2,6,6-tetramethyl-3,5-heptanedionato) ruthenium.

24. The device of claim 22 wherein said second component is selected from the group consisting of $Sr(2,2,6,6$-tetramethyl-3,5-heptanedionate$)_2$, or Sr bis (triisopropylcyclopentadienyl).

25. The device of claim 22 wherein said first component is about 50–500A thick.

26. The device of claim 22 wherein said second component is about 50–500A thick.

27. A method of fabricating a $SrRuO_3$ film, comprising:
    depositing a first component of said film on a substrate at a first temperature;
    depositing a second component of said film on said substrate at a second temperature higher than said first temperature wherein said deposition of said second component is performed separately from said first component, and wherein said deposition of said first and second component is performed by ALD; and
    annealing said first and second components to form a $SrRuO_3$ thin film.

28. A method of fabricating a $SrRuO_3$ film, comprising:
    depositing a first component of said film on a substrate at a first temperature;

depositing a second component of said film on said substrate at a second temperature higher than said first temperature wherein said deposition of said second component is performed separately from said first component, and wherein said first and second components are deposited at a pressure of about 0.5–10 torr; and annealing said first and second components to form a $SrRuO_3$ thin film.

29. A method of fabricating a $SrRuO_3$ film, comprising:

depositing a first component of said film on a substrate at a first temperature by using a bubbler to generate a first vapor component;

depositing a second component of said film on said substrate at a second temperature higher than said first temperature wherein said deposition of said second component is performed separately from said first component; and annealing said first and second components to form a $SrRuO_3$ thin film.

30. The method of claim 29, wherein said bubbler utilizes a He carrier.

31. The method of claim 29, wherein said bubbler utilizes an Ar carrier.

32. The method of claim 29, wherein said bubbler utilizes an $N_2$ carrier.

33. The method of claim 29, wherein said bubbler utilizes an CO carrier.

34. The method of claim 29, wherein said bubbler utilizes a gas inert to a Ru precursor.

35. A method of fabricating a $SrRuO_3$ film, comprising:

depositing a first component of said film on a substrate at a first temperature;

depositing a second component of said film on said substrate at a second temperature higher than said first temperature wherein said deposition of said second component is performed separately from said first component, and wherein said deposition of said second component comprises the use of a vaporizer to generate a second vapor component; and annealing said first and second components to form a $SrRuO_3$ thin film.

* * * * *